US007454559B2

(12) United States Patent
Dietrich

(10) Patent No.: US 7,454,559 B2
(45) Date of Patent: *Nov. 18, 2008

(54) FILTERING BIT POSITION IN A MEMORY

(75) Inventor: Stefan Dietrich, Türkenfeld (DE)

(73) Assignee: Infineon Technologies AG, Munich (DE)

( * ) Notice: Subject to any disclaimer, the term of this patent is extended or adjusted under 35 U.S.C. 154(b) by 272 days.

This patent is subject to a terminal disclaimer.

(21) Appl. No.: 11/386,377

(22) Filed: Mar. 22, 2006

(65) Prior Publication Data

US 2007/0226430 A1 Sep. 27, 2007

(51) Int. Cl.
*G06F 12/00* (2006.01)

(52) U.S. Cl. ........................ 711/105; 711/154; 711/167

(58) Field of Classification Search ....................... None
See application file for complete search history.

(56) References Cited

U.S. PATENT DOCUMENTS

| | | | | |
|---|---|---|---|---|
| 6,731,567 | B2 | 5/2004 | Acharya et al. | |
| 7,203,127 | B1 * | 4/2007 | Tamlyn et al. | 365/233.11 |
| 2004/0022099 | A1 | 2/2004 | Ozawa | |
| 2005/0220239 | A1 | 10/2005 | Sigurdsson et al. | |
| 2005/0254307 | A1 | 11/2005 | Dietrich et al. | |
| 2007/0070788 | A1 * | 3/2007 | Tamlyn et al. | 365/233 |

* cited by examiner

*Primary Examiner*—Kevin Verbrugge
(74) *Attorney, Agent, or Firm*—Dicke, Billig & Czaja, PLLC

(57) ABSTRACT

A memory includes a plurality of first-in-first-out (FIFO) cells, an output pointer counter, a write training block and a temporary data register. The output pointer counter is for switching a value of a FIFO output pointer among the FIFO cells. The write training block is for moving the FIFO output pointer based on data read from the FIFO cells. The temporary data register is for storing a single bit representing one or more bits in each FIFO cell.

30 Claims, 9 Drawing Sheets

100
105
110
115
Memory
120
Controller
Write training block

110
OUTP Counter
225
FIFO
215
DOUT
262
to memory array
250
INP Counter
220
INP
6
240
OUTP
6
245
WDQS
265
CLK
WRITE_I
OUTPUT_MUX
270
260
6
255
DIN_I
235
RCV block
210
DIN
230
PAD
205
Write training block
120
OUTP
6
WRITE
280
EN_WRITE_TRAINING
275
CLK
285

225
305
Counter
CLK
330
OUTPUT_C
320
310
MUX
OUTPUT_MUX
260
OUTP_S
325
CLK
335
315
resync
OUTP
325

400
Initiate write training process
405
Perform a number of NOPs
410
Write data pattern into FIFO
415
420
Data pattern registered in correct position?
yes
no
Correct FIFO output pointer
425
Terminate write training process
430

500
505
CLK#
510
CLK
515
Com.
520
WDQS
525
DQ
530
FIFO
Output
Pointer
0
1
2
3
4
5
6
7
8
9
10
WR
NOP
535
540
WL=2
545
BL=2tCK
555
550
560

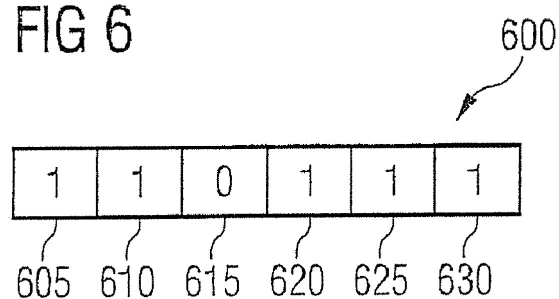
FIG 6
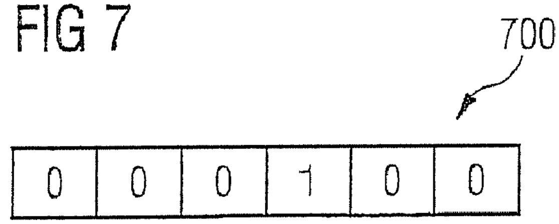
FIG 7
FIG 8
| | | | | | | |
|---|---|---|---|---|---|---|
| 805 Temporary Data Register (Inverted) | 0 | 0 | 1 | 0 | 0 | 0 |
| (815) | & | & | & | & | & | & |
| 810 Output Pointer Register | 0 | 0 | 0 | 1 | 0 | 0 |
| | = | = | = | = | = | = |
| 820 Result | 0 | 0 | 0 | 0 | 0 | 0 |

1200
1205
WDQS
1210
DQ
1205
WDQS
1215
DQ
1220
1225

FILTERING BIT POSITION IN A MEMORY

CROSS-REFERENCE TO RELATED APPLICATIONS

This application is related to U.S. patent application Ser. No. 11/386,360, entitled "MEMORY INCLUDING A WRITE TRAINING BLOCK," U.S. patent application Ser. No. 11/386,176, entitled "FINDING A DATA PATTERN IN A MEMORY," and U.S. patent application Ser. No. 11/386,510, entitled "MEMORY INCLUDING AN OUTPUT POINTER CIRCUIT," all filed concurrently on the same day with the present application and all incorporated herein by reference.

BACKGROUND

Graphics-intensive applications executed by a processor-based device, such as a computer, are becoming increasingly pervasive. Such applications include computer-aided design (CAD) applications, video games, imaging applications, and the like. A number of these applications operate in real-time, requiring the processing device to render the graphics at very fast speeds. As consumers and programmers continually demand greater graphics complexity in their applications, the devices rendering the graphics must continually improve as well.

The processor-based device may rely, at least in part, on a graphics (i.e., video) card for displaying graphics on a display device, such as a monitor. A graphics card typically includes one or more dedicated graphics processors, which are optimized for graphics rendering. A graphics card typically also includes one or more dedicated memories, such as a synchronous graphics random access memory (SGRAM), which are essentially a specialized synchronous dynamic random access memory (SDRAM) for use on graphics cards.

A continuing challenge for memory designers is increasing performance, that is, the speed at which data is transferred to and from memory. Double data rate dynamic random access memory (DDR DRAM) increases performance by providing for two data accesses within a single clock cycle, that is, by enabling the memory to read data on both the rising and falling edges of each clock cycle. This essential concept of the DDR DRAM has been extended to SDRAMs and SGRAMs, resulting in DDR SDRAM and DDR SGRAM.

A number of graphics cards utilize graphics double data rate (GDDR) SGRAM. The Joint Electron Devices Engineering Council (JEDEC) maintains, inter alia, a GDDR4 SGRAM specification, which defines a minimum set of requirements for JEDEC-standard-compatible GDDR4 SGRAM devices. For illustrative purposes only, we refer to Ballot Template Version draft rev. G of the GDDR4 SGRAM specification (hereinafter "GDDR4 SGRAM specification"), the disclosure of which is incorporated herein by reference.

The GDDR4 SGRAM specification defines the use of two uni-directional data strobe signals: a read data strobe signal (RDQS) and a write data strobe signal (WDQS). The RDQS is a data strobe transmitted by the GDDR4 SGRAM during READs, and is edge-aligned with data for READs. The WDQS is a data strobe sent by a memory controller during WRITEs, and is center-aligned with data for WRITEs.

During a write access, the first valid data-in element is registered on the rising edge of the WDQS following the write latency (WL), which is programmable via the mode register (MR). Subsequent data elements are registered on successive edges of the WDQS. According to the GDDR4 SGRAM specification, the WL may be set from one to seven clock cycles.

The time between the WRITE command (i.e., at the rising edge of the external clock (CLK)) and the first valid edge of WDQS is referred to as the TDQSS. According to the GDDR4 SGRAM specification, the TDQSS is specified relative to the WL between (WL −0.25CLK) and (WL +0.25CLK).

A proposed graphics standard known as GDDR5 SGRAM defines the TDQSS by a specific range, −500 to +500 picoseconds (ps), from the CLK. This presents a potential problem at higher operating frequencies not present with GDDR4 SGRAM. For example, at an operating frequency of 1.25 GHz, the tolerance of −500 ps to +500 ps results in more than one-half clock cycle in each direction. By having a tolerance greater than one-half clock cycle in either direction, distinguishing between a very early phase (i.e., more than one-half clock cycle) versus a slightly late phase (i.e., less than one clock cycle) or between a very late phase (i.e., more than one clock cycle) versus a slightly early phase (i.e., less than one clock cycle) becomes difficult.

For these and other reasons, there is a need for the present invention.

SUMMARY

One embodiment of the present invention provides a memory. The memory includes a plurality of first-in-first-out (FIFO) cells, an output pointer counter, a write training block and a temporary data register. The output pointer counter is for switching a value of a FIFO output pointer among the FIFO cells. The write training block is for moving the FIFO output pointer based on data read from the FIFO cells. The temporary data register is for storing a single bit representing one or more bits in each FIFO cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 6 is a diagram illustrating one embodiment of content of a temporary data register.

FIG. 7 is a diagram illustrating one embodiment of content of an output pointer register.

FIG. 8 is a diagram illustrating one embodiment of a comparison between a temporary data register and an output pointer register.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
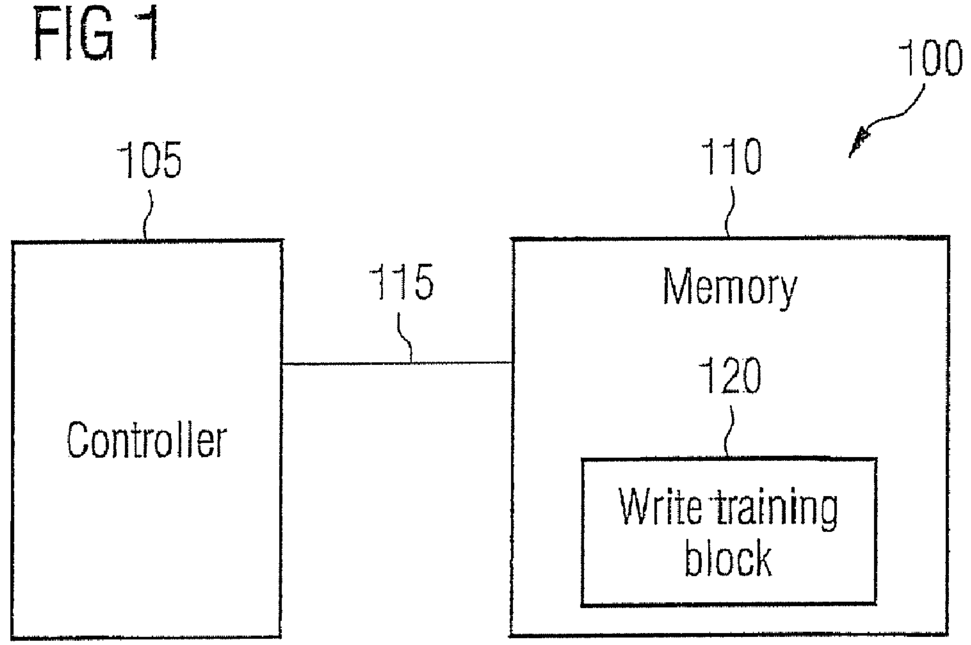
FIG. 1 is a block diagram illustrating one embodiment of an electrical system.

FIG. 1 is a block diagram illustrating one embodiment of an electrical system 100. Electrical system 100 includes a controller 105 and a memory 110. Controller 105 is electrically coupled to memory 110 via memory communications path 115. Controller 105 reads data from and writes data into memory 110 via memory communications path 115. In one embodiment, electrical system 100 is a video card. In one embodiment, controller 105 is a memory controller that reads video data from and/or writes video data into memory 110. In other embodiments, electrical system 20 can be any suitable electrical system and controller 105 can be any suitable controller or control logic.

Memory 110 includes a write training block 120. Write training block 120 synchronizes a write data strobe signal WDQS with an external clock CLK by moving or shifting an output pointer. In one embodiment, memory 110 is a GDDR5-SDRAM. In other embodiments, memory 100 is any suitable RAM, such as any suitable SDRAM.

Figure 2:
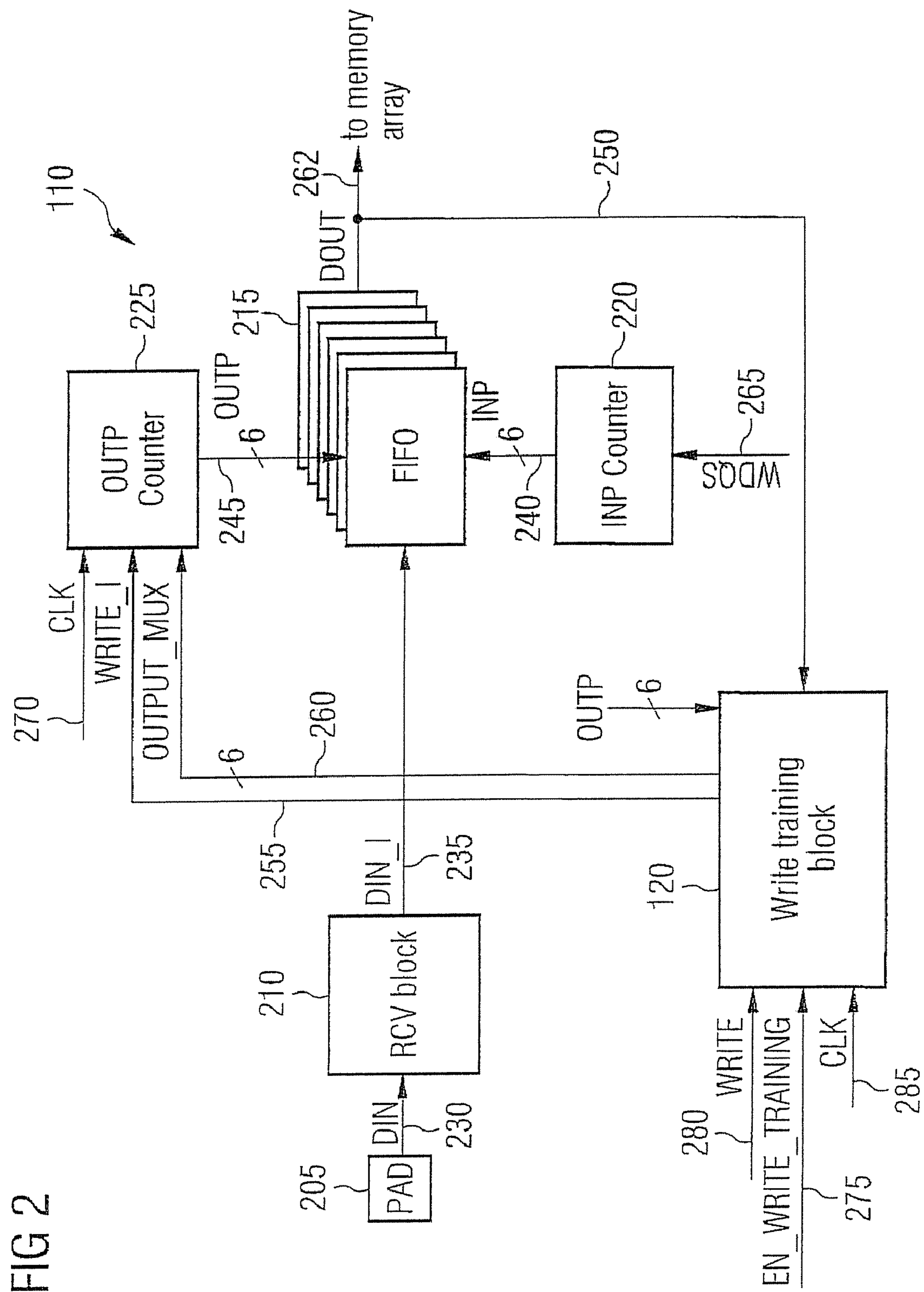
FIG. 2 is a block diagram illustrating one embodiment of a memory.

FIG. 2 is a block diagram illustrating one embodiment of memory 110. Memory 110 includes a PAD 205, a receiver (RCV) block 210, six first-in-first-out (FIFO) cells 215 (collectively referred to as "FIFO"), an input pointer (INP) counter 220, an output pointer (OUTP) counter 225, and write training block 120.

PAD 205 is electrically coupled to RCV block 210 via data-in path 230. RCV block 210 is electrically coupled to FIFO 215 via data-internal path 235. INP counter 220 is electrically coupled to FIFO 215 via input bus path 240. OUTP counter 225 is electrically coupled to FIFO 215 via parallel output bus path 245. FIFO 215 is electrically coupled to write training block 120 via a feedback path 250. Write training block 120 is electrically coupled to OUTP counter 225 via extended write path 255 and multiplexer information path 260.

The input bus path 240 and the output bus path 245 each include six bit paths to correspond to six cells in FIFO 215. However, only one of the six bit paths is logically high at a given time. The bit path that is logically high opens the corresponding cell in FIFO 215 for loading data.

PAD 205 transmits data DIN to RCV block 210 via data-in path 230. RCV block 210 transforms data DIN to internal data DIN_I based on a memory internal voltage level. FIFO 215 receives internal data DIN_I via data-internal path 235. Input pointer counter 220 receives write data strobe clock signal WDQS at 265. Incoming data into FIFO 215 is synchronous with write data strobe clock signal WDQS. Input pointer counter 220 outputs input pointer INP. Input pointer INP points to a cell in FIFO 215 for loading data. Write data strobe clock signal WDQS triggers input pointer INP. Input pointer INP switches from one cell to another cell in FIFO 215 at each rising edge of write data strobe clock signal WDQS.

FIFO 215 transforms internal data DIN_I from a write data strobe clock signal WDQS time domain to an external clock signal CLK time domain. This is important because commands (e.g., write) are in external clock signal CLK time domain.

Each cell in FIFO 215 stores one or more bits. In one embodiment, FIFO 215 stores four bits. In one embodiment, FIFO 215 includes one or more master-slave flip-flops.

FIFO 215 is of a size sufficient to account for a total number clock cycles resulting from a write latency (WL), a burst length (BL) and any clock uncertainty. In one embodiment, given a write latency of two clocks (WL=2), a burst length of two clocks (BL=2), and a clock uncertainty of one clock, the FIFO is five cells deep (2+2+1).

Data DOUT stored in FIFO 215 is written into one or more memory arrays in memory 110 at 262. Data DOUT is also transmitted to write training block 120 via feedback path 250.

Output pointer counter 225 receives external clock signal CLK at 270. Outgoing data from FIFO 215 is synchronous with external clock signal CLK. Output pointer counter 225 outputs output pointer OUTP. Output pointer OUTP points to a cell in FIFO 215 for outputting data. External clock signal CLK triggers output pointer OUTP. Output pointer OUTP switches from one cell to another cell in FIFO 215 at each rising edge of external clock CLK. Output pointer OUTP is also latched by external clock CLK to write training block 120.

Write training block 120 receives an enable write training signal EN_WRITE_TRAINING at 275 from memory controller 105. Write training block 120 receives a write command WRITE at 280 from memory controller 105. Write training block 120 also receives external clock signal CLK at 285. Enable write training signal EN_WRITE_TRAINING indicates the start of a write training process for synchronizing write data strobe signal WDQS with external clock CLK. In one embodiment, enable write training signal EN_WRITE_TRAINING is programmed into the extended mode register set (EMRS) of memory 110.

Write training block 120 transforms the write command WRITE into extended write command WRITE_I. Write training block 120 transmits extended write command WRITE_I to output pointer counter 225 via extended write path 255. Extended write command WRITE_I reads out the entire FIFO 215. Write training block 120 also transmits multiplexer information OUTP_MUX via multiplexer information path 260. Multiplexer information OUTP_MUX provides information for output pointer counter 225 to move or shift output pointer OUTP.

In one embodiment, the read-out operation of the FIFO 215 is extended by using a temporary data register (not shown) to store content as it is read out. Without the temporary data register, the old read-out content from FIFO 215 will be overwritten by new read-out content from FIFO 215. In one embodiment, memory 110 further includes an output pointer register (not shown) for storing the value of output pointer OUTP during the beginning of the extended read-out operation.

Figure 3:
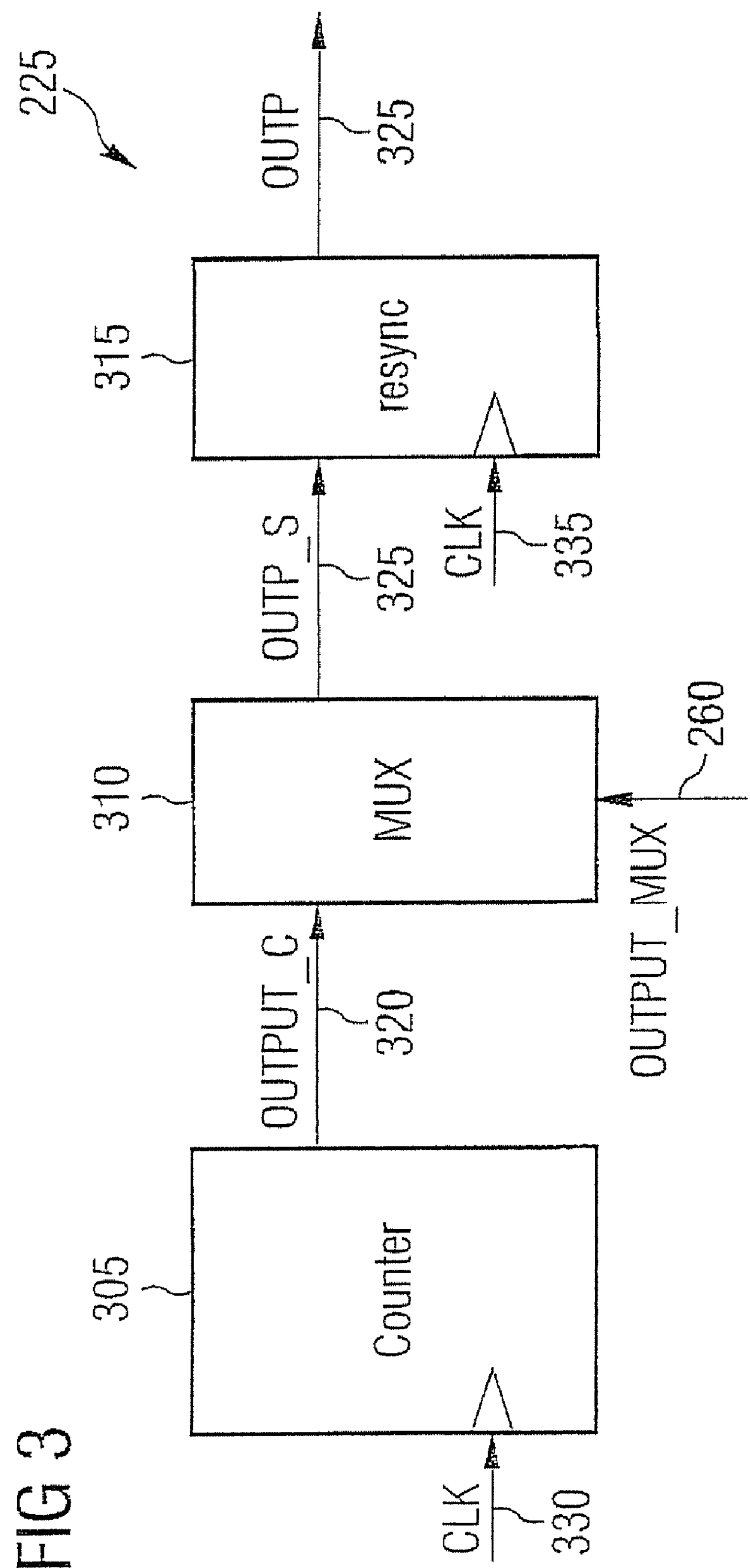
FIG. 3 is a block diagram illustrating one embodiment of an output pointer counter.

FIG. 3 is a block diagram illustrating one embodiment of an output pointer counter. Output pointer counter 225 includes a counter 305, a multiplexer 310 and a resynchronization block 315. Counter 305 is electrically coupled with multiplexer 310 via multiplexer path 320. Multiplexer 310 is electrically coupled with resynchronization block 315 via resynchronization path 325.

Counter 305 receives external clock signal CLK at 330. MUX 310 receives current output pointer OUTP_C from counter 305 via multiplexer path 320. MUX 310 receives multiplexer information OUTP_MUX from write training block 120 via multiplexer information path 260. MUX 310 moves or shifts current output pointer OUTP_C and outputs scrambled output pointer OUTP_S based on multiplexer information OUTP_MUX. Resynchronization block 315 receives scrambled output pointer OUTP_S from MUX 310 via resynchronization path 325. Resynchronization block 315 also receives external clock signal CLK at 335. Resynchronization block 315 aligns scrambled output pointer OUTP_S to external clock signal CLK and outputs output pointer OUTP at 340.

Figure 4:
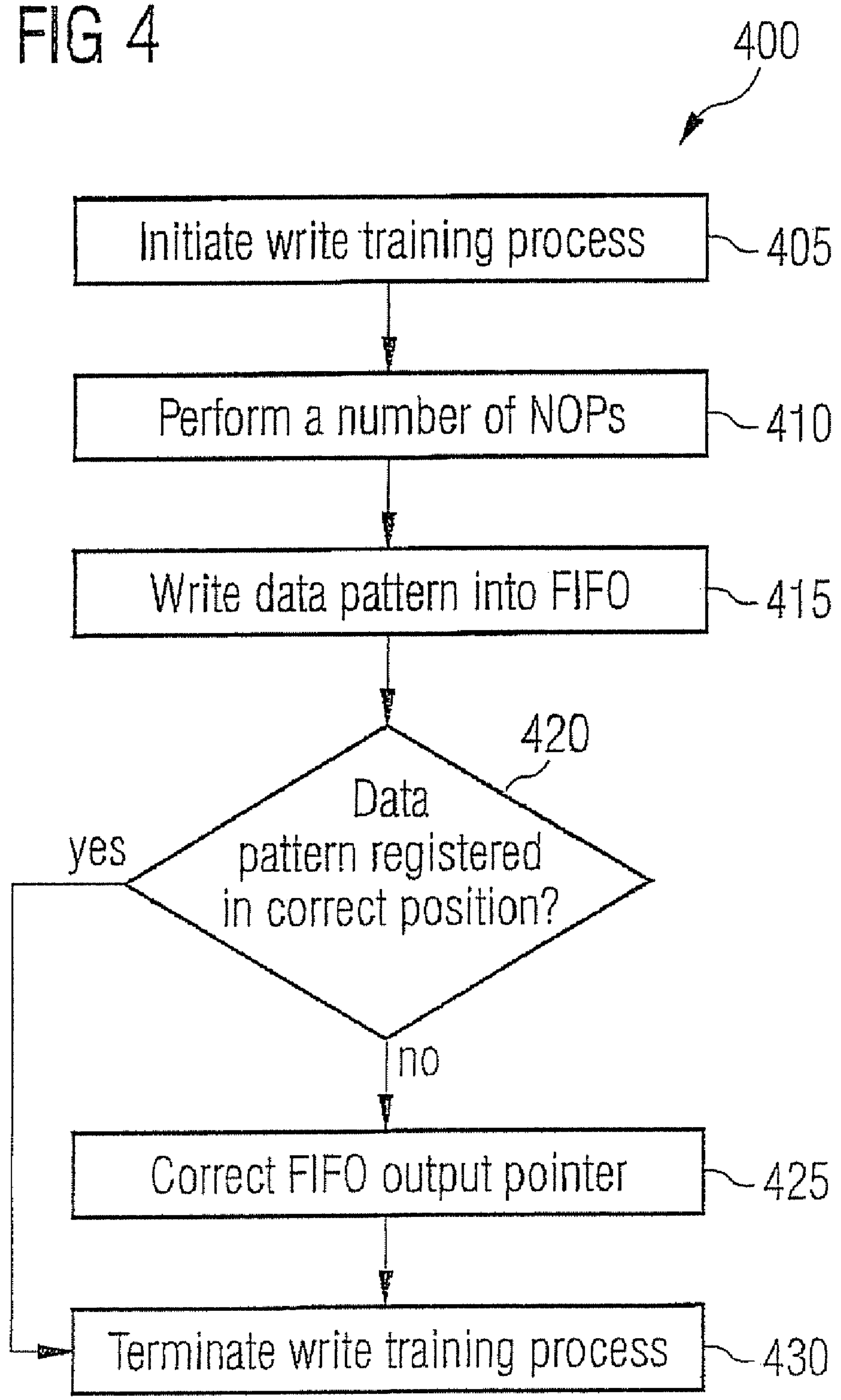
FIG. 4 is a flow diagram illustrating one embodiment of a write training process.

FIG. 4 is a flow diagram illustrating one embodiment of a write training process. In one embodiment, write training process 400 is performed by memory controller 105 and write training block 120. Write training process 400 determines whether write data strobe clock signal WDQS is synchronized with respect to external clock signal CLK. If it is determined that write data strobe clock signal WDQS is not synchronized with respect to external clock signal CLK, write training process 400 synchronizes write data strobe clock signal WDQS with external clock signal CLK.

Write training process 400 is initiated at 405. In one embodiment, memory controller 105 sends an extended memory register set (EMRS) command to write training block 120 for initiating at 405 write training process 400.

A given number of no-operation (NOP) operations are performed at 410. In one embodiment, memory controller 105 initiates NOP operations via PAD 205. Each NOP operations effectively places a series of ones (1s) into each FIFO cell. In one embodiment, NOP operations are used to reset the FIFO cells.

A given data pattern is written at 415 into FIFO 215. In one embodiment, memory controller 105 writes the data pattern via PAD 205. In one embodiment, the data pattern includes a zero (0) to differentiate the data pattern from the ones (1s) written into FIFO 215 by the NOP operations. In one embodiment, a data pattern of "1101 1111" is inserted into FIFO 215 given a burst length of eight (BL=8).

It is determined at 420 whether the data pattern is registered in the correct position. In one embodiment, the determination at 420 of whether the data pattern is registered in the correct position is made by analyzing the entire content of FIFO 215 (e.g., acquired by a complete read-out of FIFO 215) along with the address of output pointer OUTP at the beginning of the read-out operation.

During write training process 400, FIFO 215 is completely read out to determine whether the data pattern is registered in the correct position. During a typical write command WRITE, the only cells in FIFO 215 that are read out are the cells written into by the write command WRITE. To read out the entire FIFO, an extended write command WRITE_I is used.

If the data pattern is in an incorrect position, then output pointer OUTP is corrected at 425. In one embodiment, output pointer OUTP is moved. In another embodiment, output pointer OUTP is shifted. In one embodiment, output pointer OUTP is shifted by output pointer counter 225. In one embodiment, during blocks 420 and 425, a given number of NOP operations are performed. Blocks 415 to 425 are repeated until it is determined at 420 that the data pattern is registered in the correct position. At that time, write training process 400 is terminated at 430. In one embodiment, memory controller 105 sends an EMRS command to write training block 120 for terminating at 430 write training process 400.

Figure 5:
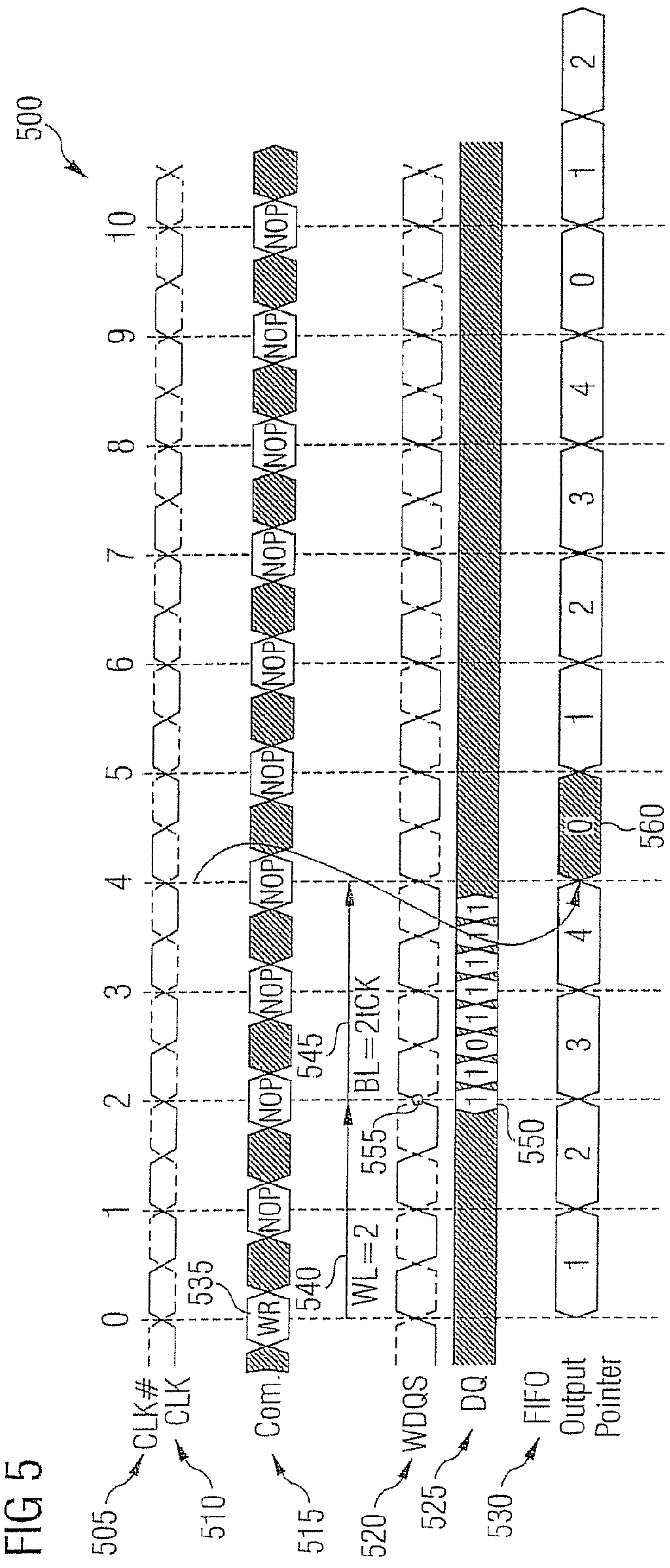
FIG. 5 is a timing diagram illustrating one embodiment of an operation of a write command.

FIG. 5 is a timing diagram illustrating the operation of a write command. Timing diagram 500 includes a differential clock pair, CLK# 505 and CLK 510, a command (Com.) signal 515, a continuous write data strobe clock signal WDQS 520, a data (DQ) signal 525, and an output pointer OUTP signal 530.

At external clock CLK zero (CLK 0), memory controller 105 initiates a write command (WR) 535 in memory 110. In this example, memory 110 has a write latency 540 of two clock cycles (WL=2) and a burst length 545 of eight bits (BL=8) taking approximately two clock cycles of external clock signal CLK 510. After write latency 540, data DQ 525 beginning at 550 is written into FIFO 215 at external clock CLK two (CLK 2). Four bits of data DQ 525 are written into FIFO 215 at consecutive rising edges of write data strobe signal WDQS 520 beginning at 555. In this example, the data pattern "1101 1111" is written into FIFO 215. If, for example, FIFO 215 stores four bits in each cell, then "1101" is stored in one cell and "1111" is stored in another cell. The determination of which cells in FIFO 215 are being written into is determined by input pointer INP.

Output pointer OUTP 530 changes at each rising edge of external clock signal 510. At external clock CLK four (CLK 4), output pointer OUTP 530 points to cell zero (0) 560. Data is read out of FIFO 215 beginning at cell zero (0) 560.

FIG. 6 is a diagram illustrating content of a temporary data register. Temporary data register 600 stores the contents read out from FIFO 215. In one embodiment, temporary data register 600 contains a number of bits corresponding to the depth of FIFO 215. In this example, temporary data register 600 contains six bits corresponding to six cells in FIFO 215.

Each value of temporary data register 600 represents one cell in FIFO 215. That is, although each cell in FIFO 215 can contain more than one bit, any multiple bits are simplified into a single bit, zero (0) or one (1). As described in greater detail below with respect to FIG. 12, a one (1) indicates that a cell in FIFO 215 contains all one (1) bits, and a zero (0) indicates that the cell in FIFO 215 contains a zero (0) bit. Therefore, temporary data register 600 values of [1, 1, 0, 1, 1, 1] indicate that first cell 605, second cell 610, fourth cell 620, fifth cell 630 and sixth cell 635 in FIFO 215 contain all ones (1s), and that third cell 615 in FIFO 215 contains a zero (0).

FIG. 7 is a diagram illustrating content of an output pointer register. Output pointer register 700 stores the value of output pointer OUTP during the beginning of the extended read-out operation. Output pointer register 700 contains the values [0, 0, 0, 1, 0, 0].

Figure 9:
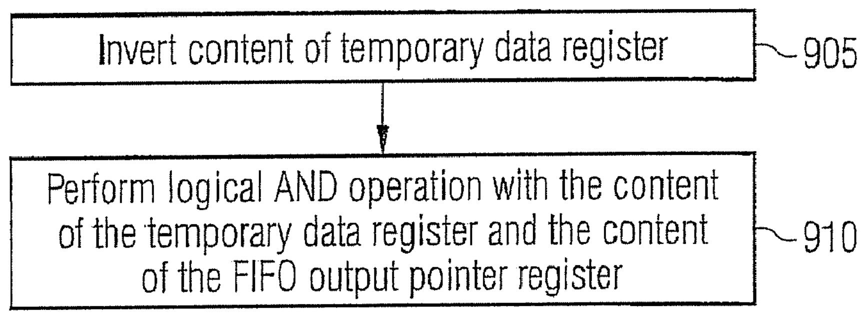
FIG. 9 is a flow diagram illustrating one embodiment of a method for comparing a temporary data register and an output pointer register.

FIG. 8 is a diagram illustrating one embodiment of a comparison between a temporary data register and an output pointer register. FIG. 9 is a flow diagram illustrating one embodiment of a method for comparing a temporary data and an output pointer register. FIG. 8 will be described in conjunction with FIG. 9.

The content of temporary data register 600 is inverted at 905. Inverted content 805 contains the values [0, 0, 1, 0, 0, 0]. Output pointer register content 810 contains the values [0, 0, 0, 1, 0, 0]. A logical AND 815 is performed at 910 with inverted content 805 and output pointer register content 810. The result 820 of the logical AND is [0, 0, 0, 0, 0]. The series of zeros (0s) without a one (1) indicates that the data pattern (i.e., the data pattern used in write training process 400) is not located in the correct and estimated position in FIFO 215.

Figure 10:
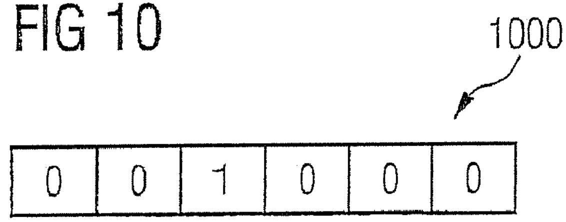
FIG. 10 is a diagram illustrating one embodiment of content of an output pointer register.

FIG. 10 is a diagram illustrating one embodiment of content of an output pointer register. Output pointer register 1000 contains the value of output pointer OUTP after it has been shifted by MUX 310. Output pointer register 1000 contains the values [0, 0, 1, 0, 0, 0].

Figure 11:
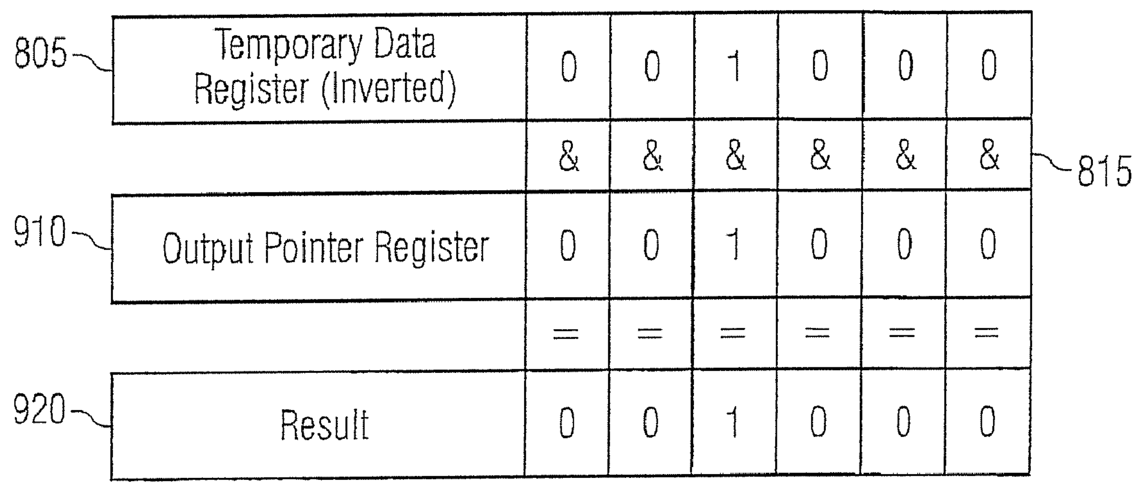
FIG. 11 is a diagram illustrating one embodiment of a comparison between a temporary data register and an output pointer register.

FIG. 11 is a diagram illustrating one embodiment of a comparison between a temporary data register and an output pointer register. Temporary data register 600 is used again because the TDQSS does not change.

The content of temporary data register 600 is inverted at 905. Inverted content 805 contains the values [0, 0, 1, 0, 0, 0]. Output pointer register content 910 contains the values [0, 0, 1, 0, 0, 0]. A logical AND 815 is performed at 910 with inverted content 805 and output pointer register content 910. The result 920 of the logical AND is [0, 0, 1, 0, 0, 0]. The one (1) indicates that the data pattern is located in the correct position in FIFO 215. Thus, the correct relationship between input pointer INP and output pointer OUTP is established. In one embodiment, the adjustment of MUX 310 is stored in a register, and write training process 400 is terminated at 430.

As described above with respect to FIG. 6, temporary data register 600 contains a simplified view of each cell in FIFO 215. That is, regardless of the number of bits contained in each cell in FIFO 215, temporary data register 600 associates only a single bit to each cell.

Figure 12:
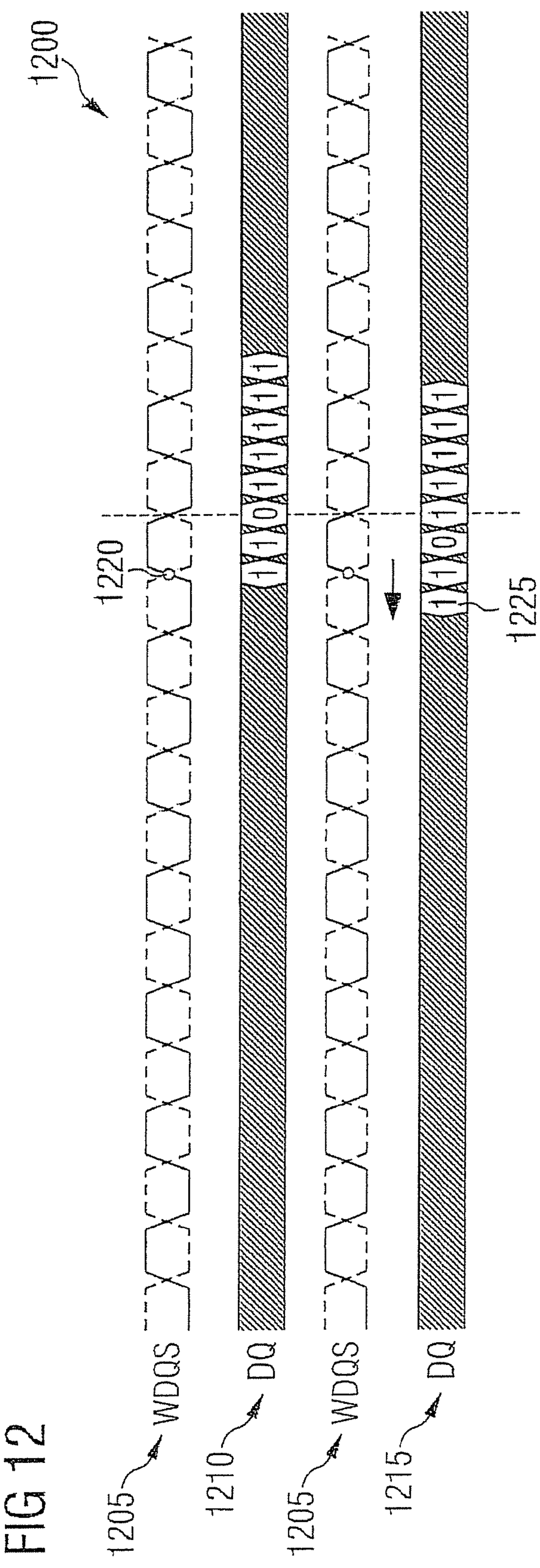
FIG. 12 is a timing diagram illustrating one embodiment of bit positioning uncertainty.

A potential problem during write accesses is the inaccuracy of the bit position. FIG. 12 is a timing diagram illustrating one embodiment of bit positioning uncertainty. Timing diagram 1200 illustrates a WDQS signal 1205. Timing diagram 1200 further illustrates an aligned data DQ signal 1210, which is aligned with WDQS signal 1205, and a misaligned data DQ signal 1215, which is misaligned relative to WDQS signal 1205. In this example, a rising edge 1220 of WDQS signal 1205 is aligned with “1101” of aligned data DQ signal 1210. However, rising edge 1220 of WDQS signal 1205 is misaligned with “1011” of misaligned data DQ signal 1215. That is, the first one (1) 1225 is lost.

Figure 13:
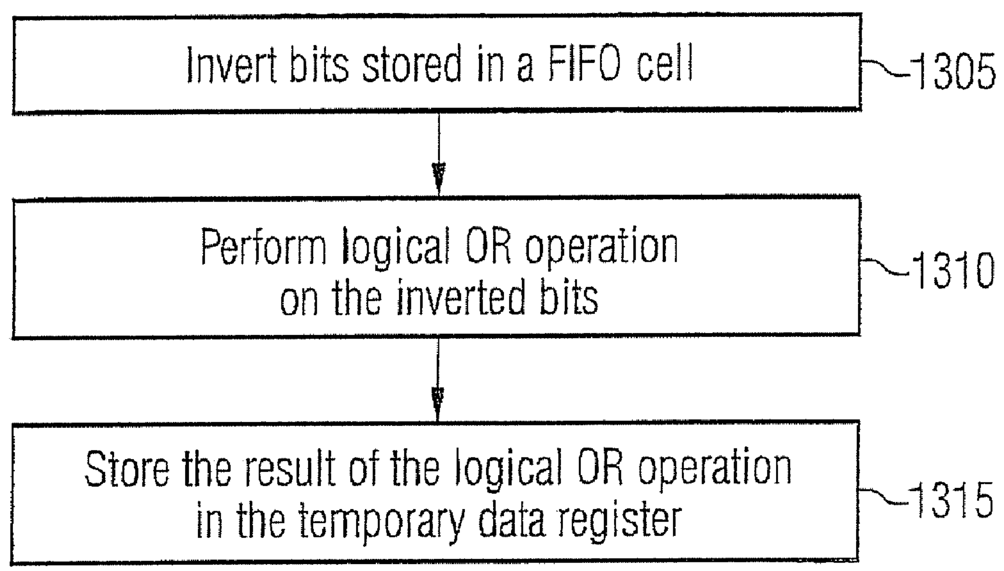
FIG. 13 is a flow diagram illustrating one embodiment of a method for eliminating bit position uncertainty.

FIG. 13 is a flow diagram illustrating one embodiment of a method for eliminating bit position uncertainty. The bits stored in a cell in FIFO 215 are inverted at 1305. A logical OR is performed at 1310 on the inverted bits. The result of the logical OR operation (i.e., a zero or one) is stored at 1315 in temporary data register 600.

For example, if a cell in FIFO 215 contains “1111,” the inverted value is “0000.” The result of a logical OR on “0000” is a zero (0). For another example, if a cell in FIFO 215 contains “1011,” the inverted value is “0100.” The result of a logical OR on “0100” is a one (1).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory, comprising:
- a plurality of first-in-first-out (FIFO) cells;
- an output pointer counter for switching a value of a FIFO output pointer among the FIFO cells;
- a write training block for generating information for moving the FIFO output pointer based on data read from the FIFO cells; and
- a temporary data register for storing a single bit representing one or more bits in each FIFO cell.

2. The memory of claim 1, further comprising:
- an input pointer counter for switching a value of a FIFO input pointer among the FIFO cells.

3. The memory of claim 1, wherein the write training block receives the value of the FIFO output pointer and data read-out from the FIFO cells.

4. The memory of claim 1, wherein the write training block switches the memory between a normal mode with a normal write cycle and a write training mode with an extended write cycle.

5. The memory of claim 1, wherein a TDQSS of the memory has a range greater than one-half clock cycle early or late.

6. The memory of claim 1, wherein the single bit is a result of executing a logical OR on an inverse of the one or more bits in the each FIFO cell.

7. A memory, comprising:
- a plurality of first-in-first-out (FIFO) cells for accepting a data pattern;
- an output pointer counter for switching a value of a FIFO output pointer among the FIFO cells in response to an external clock;
- a write training block for extending a write cycle for reading out all the FIFO cells, for determining whether the data pattern is located in a correct position in the FIFO cells, and for generating information for moving the FIFO output pointer from one FIFO cell to another FIFO cell if it is determined that the data pattern is located in the incorrect position; and
- a temporary data register for storing a single bit of data for each FIFO cell, wherein the single bit is a representation of the content of each FIFO cell.

8. The memory of claim 7, further comprising:
- an input pointer counter for switching a value of a FIFO input pointer among the FIFO cells in response to a write data strobe clock signal.

9. The memory of claim 7, wherein the write training block accepts as input the value of the FIFO output pointer and data read-out from the FIFO cells.

10. The memory of claim 7, wherein the write training block switches the memory between a normal mode with a normal write cycle and a write training mode with the extended write cycle.

11. The memory of claim 7, wherein a TDQSS of the memory has a range greater than one-half clock cycle early or late.

12. The memory of claim 7, wherein the single bit is a result of executing a logical OR on an inverse of every bit in the each FIFO cell.

13. A method of synchronizing a write data strobe clock signal with an external clock signal, comprising:
- writing a data pattern into a first-in-first-out (FIFO) buffer;
- reading out contents of the entire FIFO buffer;
- determining a single bit to represent the contents of each cell in the FIFO buffer;

inverting the single bits;

receiving a value of a FIFO output pointer at the beginning of the reading out contents of the entire FIFO buffer;

executing a logical AND on the inverted bits and the value of the FIFO output pointer; and shifting the FIFO output pointer if the result of executing the logical AND is only zeros.

14. The method of claim 13, further comprising:

executing a plurality of no-operation (NOP) operations for resetting the FIFO buffer.

15. The method of claim 13, wherein writing the data pattern comprises:

writing a data pattern comprising a plurality of ones and only a single zero.

16. The method of claim 13, further comprising:

receiving a start command from an extended memory register set (EMRS).

17. The method of claim 13, further comprising:

aligning the shifted FIFO output pointer with an external clock.

18. The method of claim 13, wherein determining the single bit to represent the contents of each cell in the FIFO buffer, comprises:

inverting the contents of each cell in the FIFO buffer;

executing a logical OR on the inverted contents; and storing the result of executing the logical OR in a temporary data register.

19. A method of synchronizing a write data strobe clock signal with an external clock signal, comprising:

(a) writing a data pattern into a first-in-first-out (FIFO) buffer;

(b) reading out contents of the entire FIFO buffer;

(c) determining a single bit to represent the contents of each cell in the FIFO buffer;

(d) inverting the single bits;

(e) receiving a value of a FIFO output pointer at the beginning of the reading out contents of the entire FIFO buffer;

(f) executing a logical AND on the inverted bits and the value of the FIFO output pointer;

(g) shifting the FIFO output pointer if the result of executing the logical AND is only zeros; and (h) repeating (a) to (g) until the result of (f) provides a one.

20. The method of claim 19, further comprising:

executing a plurality of no-operation (NOP) operations for resetting the FIFO buffer.

21. The method of claim 19, wherein writing the data pattern comprises:

writing a data pattern comprising a plurality of ones and only a single zero.

22. The method of claim 19, further comprising:

receiving a start command from an extended memory register set (EMRS).

23. The method of claim 19, further comprising:

aligning the shifted FIFO output pointer with an external clock.

24. The method of claim 19, wherein determining the single bit to represent the contents of each cell in the FIFO buffer, comprises:

inverting the contents of each cell in the FIFO buffer;

executing a logical OR on the inverted contents; and storing the result of executing the logical OR in a temporary data register.

25. A random access memory, comprising:

means for writing a data pattern into a first-in-first-out (FIFO) buffer;

means for reading out contents of the entire FIFO buffer;

means for determining a single bit to represent the contents of each cell in the FIFO buffer;

means for inverting the single bits;

means for receiving a value of a FIFO output pointer at the beginning of the reading out contents of the entire FIFO buffer;

means for executing a logical AM) on the inverted bits and the value of the FIFO output pointer; and means for shifting the FIFO output pointer if the result of executing the logical AND is only zeros.

26. The random access memory of claim 25, further comprising:

means for executing a plurality of no-operation (NOP) operations for resetting the FIFO buffer.

27. The random access memory of claim 25, wherein means for writing the data pattern comprises:

writing a data pattern comprising a plurality of ones and only a single zero.

28. The random access memory of claim 25, further comprising:

means for receiving a start command from an extended memory register set (EMRS).

29. The random access memory of claim 25, further comprising:

means for aligning the shifted FIFO output pointer with an external clock.

30. The random access memory of claim 25, wherein means for determining the single bit to represent the contents of each cell in the FIFO buffer, comprises:

means for inverting the contents of each cell in the FIFO buffer;

means for executing a logical OR on the inverted contents; and means for storing the result of executing the logical OR in a temporary data register.

* * * * *